(12) United States Patent
Mochizuki et al.

(10) Patent No.: US 12,213,329 B2
(45) Date of Patent: Jan. 28, 2025

(54) SEMICONDUCTOR DEVICE

(71) Applicant: Japan Display Inc., Tokyo (JP)

(72) Inventors: Marina Mochizuki, Tokyo (JP); Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 305 days.

(21) Appl. No.: 17/720,366

(22) Filed: Apr. 14, 2022

(65) Prior Publication Data

US 2022/0238825 A1    Jul. 28, 2022

Related U.S. Application Data

(63) Continuation of application No. PCT/JP2020/033236, filed on Sep. 2, 2020.

(30) Foreign Application Priority Data

Oct. 23, 2019   (JP) ................. 2019-192521

(51) Int. Cl.
*H10K 30/82*    (2023.01)
*H10K 30/65*    (2023.01)

(52) U.S. Cl.
CPC ............. *H10K 30/82* (2023.02); *H10K 30/65* (2023.02)

(58) Field of Classification Search
CPC ........ H10K 30/82; H10K 30/65; H10K 39/00; H10K 30/81; H10K 39/32; H10K 30/00
See application file for complete search history.

(56) References Cited

U.S. PATENT DOCUMENTS

| 2002/0011972 A1 | 1/2002 | Yamazaki et al. |
| 2008/0131166 A1* | 6/2008 | Yokoyama ............. G03G 17/00 399/159 |
| 2008/0230123 A1 | 9/2008 | Mitsui et al. |
| 2011/0198484 A1 | 8/2011 | Yoshiyuki |

(Continued)

FOREIGN PATENT DOCUMENTS

| CN | 101090139 A | 12/2007 |
| CN | 103947000 A | 7/2014 |

(Continued)

OTHER PUBLICATIONS

International Search Report mailed on Nov. 17, 2020, for the corresponding PCT Application No. PCT/JP2020/033236, with English translation.

(Continued)

*Primary Examiner* — Thanh Y. Tran
(74) *Attorney, Agent, or Firm* — Michael Best & Friedrich LLP

(57) ABSTRACT

The purpose of the present invention is to prevent a decrease in light reflection characteristic and an increase in electric resistance due to oxidation of silver in a semiconductor device including an optical sensor in which silver is used for an anode of a photoconductive film. The present invention has a following structure to solve the problem: A semiconductor device includes a thin film transistor formed on a substrate 100. An electrode connected electrically to the thin film transistor is formed of a silver film 128. A first indium tin oxide (ITO) film 129 is formed on the silver film 128. An alumina (AlOx) film 130 is formed on the first ITO film 129.

17 Claims, 7 Drawing Sheets

(56) References Cited

U.S. PATENT DOCUMENTS

| | | |
|---|---|---|
| 2014/0339431 A1 | 11/2014 | Watanabe et al. |
| 2015/0034944 A1 | 2/2015 | Cho |
| 2018/0159060 A1 | 6/2018 | Verilhac et al. |
| 2019/0027550 A1 | 1/2019 | Shin et al. |
| 2023/0041812 A1* | 2/2023 | Kitamura ............... H10K 59/12 |

FOREIGN PATENT DOCUMENTS

| | | |
|---|---|---|
| JP | S63-029410 A | 2/1988 |
| JP | 2008-227091 A | 9/2008 |
| JP | 2013-251173 A | 12/2013 |
| JP | 2014-090156 A | 5/2014 |
| JP | 2014-225525 A | 12/2014 |
| JP | 2016-021380 A | 2/2016 |
| JP | 2018-521507 A | 8/2018 |
| WO | 2014-054255 A1 | 4/2014 |

OTHER PUBLICATIONS

English translation of the German Office Action dated Jun. 10, 2024 for the corresponding German Application No. 11 2020 004 244.8.
Chinese Office Action mailed on May 6, 2024 for the corresponding Chinese Application No. 202080074284.2, with English machine translation.
Office Action dated Nov. 5, 2024 for Japanese Application No. 2024-041859 with English translation.
Chinese Office Action issued on Oct. 28, 2024 for the corresponding Chinese Patent Application No. 2020800742842.

* cited by examiner

FIG. 5

ITO Forming Condition

| | | |
|---|---|---|
| DC Power | | 300 W |
| Press | | 7.3 mTorr |
| Target Current | | 1.72 A |
| Target Voltage | | 434 V |
| Temperature | | 30 °C |
| Gas flow | Ar | 140 sccm |
| | H-Ar | 5 sccm |
| | O2 | 0.05 sccm | sccm: standard cubic centimeter per minute

SEMICONDUCTOR DEVICE

The present application is a continuation application of International Application No. PCT/JP2020/033236, filed on Sep. 2, 2020, which claims priority to Japanese Patent Application No. 2019-192521, filed on Oct. 23, 2019. The contents of these applications are incorporated herein by reference in their entirety.

BACKGROUND OF THE INVENTION

(1) Field of the Invention

The present invention relates to a semiconductor device having an optical sensor using a photoelectric conversion element made of an organic material.

(2) Description of the Related Art

Optical sensors utilizing photoelectric conversion have been used in fields such as biometric authentication as well as recognition of images, and their use has spread. A photoelectric material using an organic material has been developed because it can reduce dark current, improve photoelectric conversion efficiency, and add wavelength selectivity.

As an example of an organic material used as a photoelectric conversion element, Patent Document 1 is cited. In addition, Patent Document 2 describes a film structure as a photoelectric conversion element using an organic material.

PRIOR ART REFERENCE

[Patent Document]
[Patent document 1] WO 2014-054255 A1
[Patent document 2] Japanese Patent Application Publication No. 2014-225525 A

SUMMARY OF THE INVENTION

In a sensor device of photodiode using an organic photoconductive film (herein after, an organic photoconductive film diode OPD: Organic Photo Diode), a reflective electrode is used to increase the utilization efficiency of light from the outside. Silver having high reflectivity is used as the reflective electrode. This silver is then used as one electrode of an organic photoconductive film diode. A thin film of silver of about 100 nm is used for the reflective electrode, however, such a thin film of silver has high reducing action and is oxidized by coupling with oxygen in the atmosphere immediately after film formation, resulting in a high resistance.

On the other hand, since the organic photoconductive film material is weak in moisture, it is necessary to block moisture from the atmosphere. For blocks of moisture, aluminum oxide films (also referred to as "AlOx" hereinafter) have excellent properties. Therefore, a laminated film of the silver film as a reflection electrode and alumina (AlOx) film for blocking moisture is used.

However, alumina (AlOx) contains oxygen. Further, since alumina (AlOx) is often formed by reactive sputtering, it contains more oxygen. Thus, silver laminated with alumina (AlOx) is more susceptible to oxidation by oxygen from alumina (AlOx). When silver is oxidized, it becomes high in resistance, which is unsuitable for an electrode, and further, the oxidized silver becomes black or transparent and thus cannot serve as a reflective electrode.

A purpose of the present invention is to solve a problem that a silver film is oxidized when an alumina (AlOx) film is laminated when a laminated film of a silver film and an alumina (AlOx) film is used for one electrode of a photodiode. The same applies not only to the case of a photodiode but also to an organic EL display device (OLED) using an organic material, for example.

The present invention solves the above problems, and the main specific means thereof are as follows.

(1) The semiconductor device having a thin film transistor formed on a substrate including: an electrode formed from a silver film electrically connected to the thin film transistor, a first ITO film formed on the silver film, and an alumina (AlOx) film formed on the first ITO film.

(2) The semiconductor device according to (1), in which the semiconductor device includes a photo sensor; the photo sensor includes a photodiode which includes an anode, a photoconductive film, and a cathode, and the electrode is an anode of the photo diode.

(3) The semiconductor device according to (2), in which the photoconductive film is an organic photoconductive film.

(4) The semiconductor device according to (3), in which a thickness of the first ITO film is 5 to 20 nm.

(5) The semiconductor device according to (4), in which a thickness of the silver film is 90 to 200 nm.

(6) The semiconductor device according to (5), in which a thickness of the alumina (AlOx) film is 10 to 50 nm.

(7) The semiconductor device according to (6), in which the first ITO film is an amorphous ITO film.

BRIEF DESCRIPTION OF THE DRAWINGS

FIG. 5 is a table of manufacturing condition of the ITO film;

DETAILED DESCRIPTION OF THE PREFERRED EMBODIMENTS

The contents of the present invention are described using embodiments below. In Embodiment 1, an optical sensor device for receiving light from a lower surface of a sensor array is described, and in Embodiment 2, an optical sensor device for receiving light from an upper surface of a sensor array is described. Further, the present invention is applicable to an organic EL display device (OLED) using an organic material as a light-emitting element.

Embodiment 1

Figure 1:
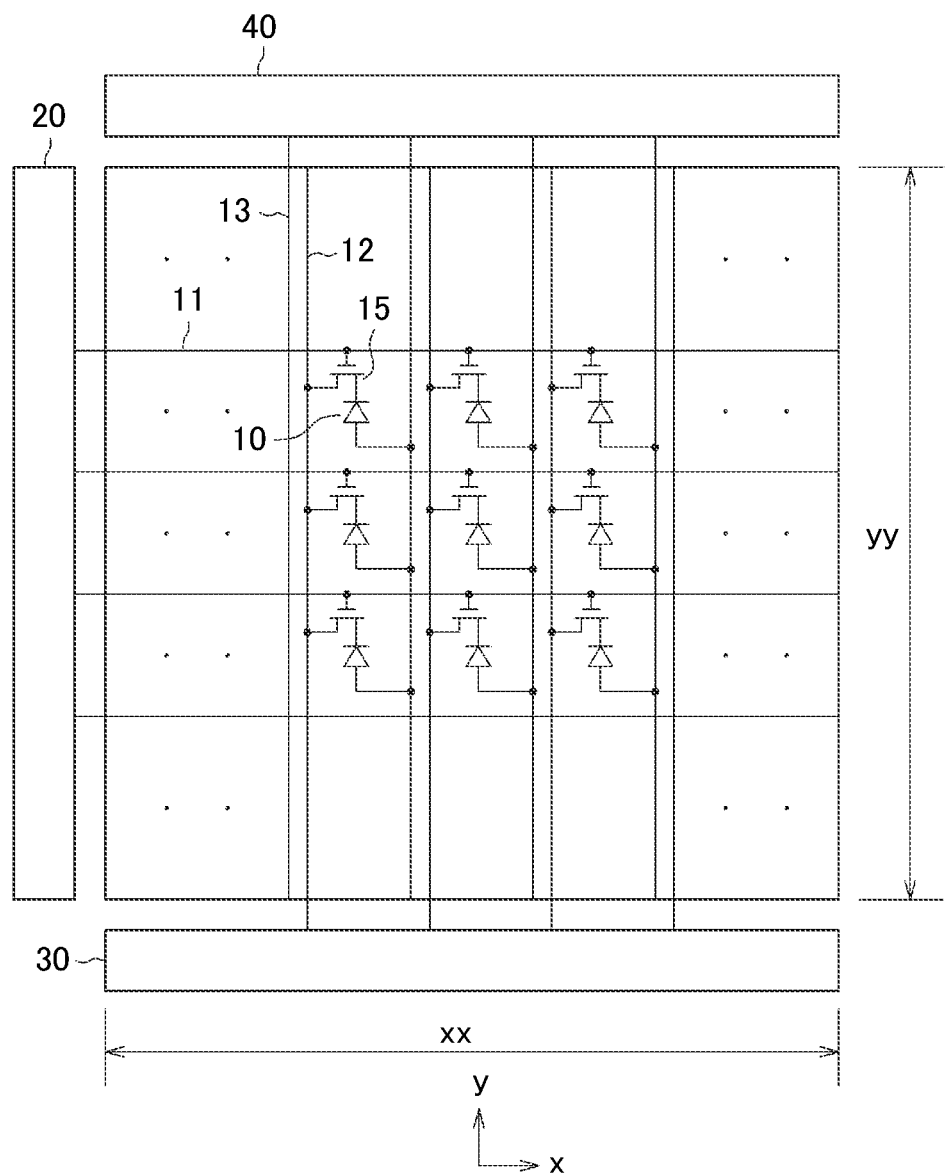
FIG. 1 is a plan view of an optical sensor device to which the present invention is to be applied.

FIG. 1 is a plan view of an optical sensor device to which the present invention is applied. In FIG. 1, sensor elements are formed in a matrix in the sensor region. For example, the sensor area has a lateral diameter xx of 3 cm and a vertical diameter yy of 3 cm. In the sensor region, scanning lines 11 extend in the horizontal direction (x-direction) and are arranged in the vertical direction (y-direction). A detection line 12 and a power supply line 13 extend in the vertical direction and are arranged in the horizontal direction. A region surrounded by a scanning line 11 and a detection line 12, or a region surrounded by a scanning line 11 and a power line 13 constitutes a sensor element. In each sensor element, a switching TFT 15 and an organic photoconductive film diode 10 are formed.

A scanning line driving circuit 20 is disposed in the lateral direction outside the sensor region, a power supply circuit 40 is disposed in the upward direction, and a detection circuit 30 is disposed in the downward direction. The scanning line driving circuit 20 and the detection circuit 30 are formed of TFTs. The scanning line 11 is sequentially selected from the upper direction by the shift register in the scanning line driving circuit 20.

The power supply line 13 is connected to an anode of each photodiode, extends in the vertical direction, and is connected to the same power supply in the power supply circuit 40 above the sensor region. Then, an anode potential is supplied to the power supply line 13. The detection line 12 is connected to the drain of the switching TFT, and the source of the switching TFT is connected to the cathode of the photodiode 10. A detection line 12 extends downward from each sensor element, and a photocurrent is detected in the detection circuit 30. In FIG. 1, when light is applied to the sensor element selected by the scanning line 11, a photocurrent is generated from the photodiode 10, and this photocurrent is detected by the detection circuit 30 through the detection line 12.

Figure 2:
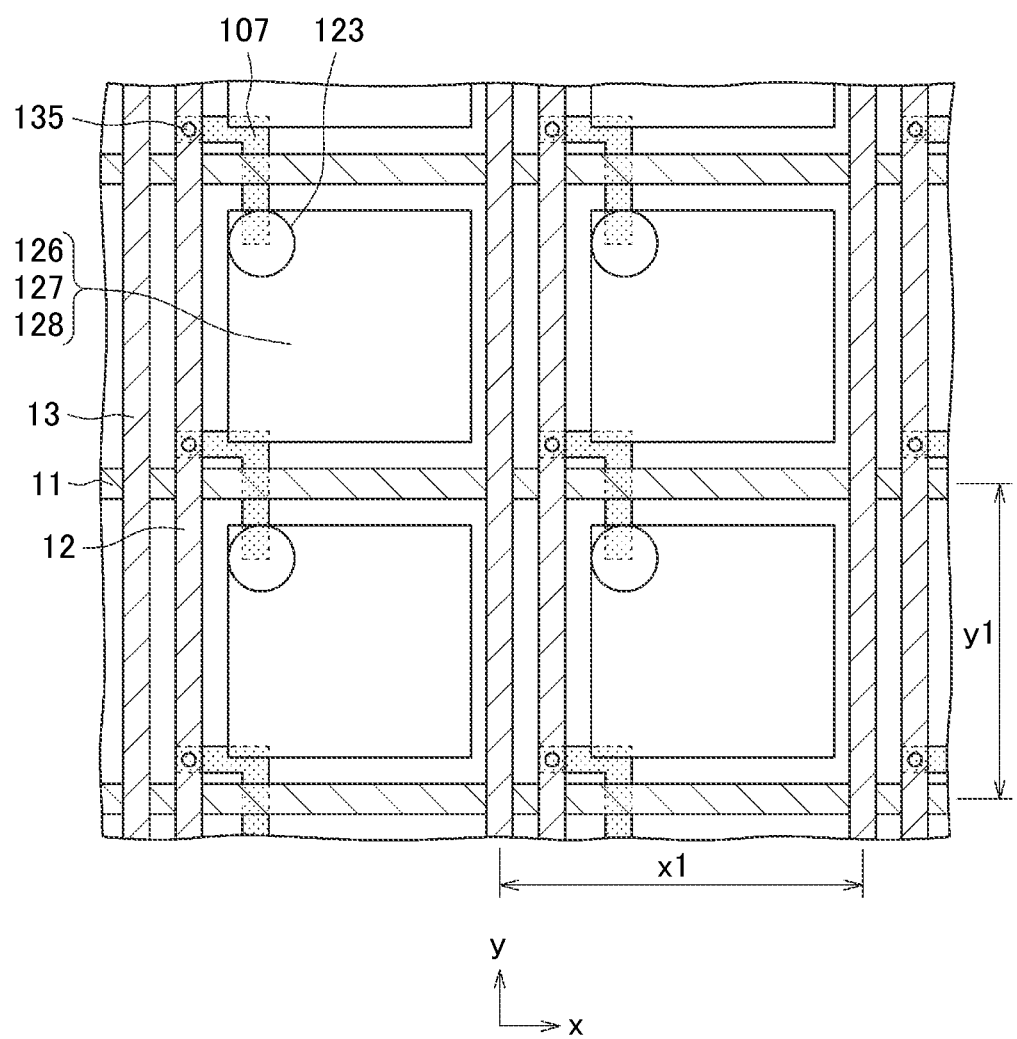
FIG. 2 is a plan view of sensor elements.

FIG. 2 is a plan view of each sensor element. In order not to complicate the drawing, some electrodes or the like are omitted from FIG. 2. The size of each sensor element is, for example, 50 μm in the lateral direction x1 and 50 μm in the vertical direction y1. In FIG. 2, the scanning lines 11 extend in the horizontal direction and are arranged in the vertical direction. Further, the power supply line 13 and the detection line 12 extend in the vertical direction and are arranged in the horizontal direction. A cathode 126 of a photodiode, an organic photoconductive film 127, an anode 128, and the like are formed in a region surrounded by a scanning line 11, a power supply line 13, or a scanning line 11 and a detection line 12.

Further, the anode electrode 128 is integrally formed over the entire sensor region. In other words, one anode electrode 128 is provided over the entire sensor region, and a plurality of cathode electrodes 126 overlap the one anode electrode 128.

The semiconductor film 107 extends in the x direction from the detection line 12 through the through hole 135, then bends, and then passes under the scan line 11. At this time, a TFT is formed. In this case, the scanning line 11 becomes the gate electrode of the TFT. The semiconductor film 107 extends in the y direction and is connected to the cathode 126 of the photodiode formed of ITO in the through hole 123. As described in FIG. 3, the through hole 123 is formed in the thick organic passivation film 122, therefore the diameter of the through hole 123 is large. An organic photoconductive film 127 is formed on the cathode 126, and an anode 128 is formed thereon by a silver film. Thus, an organic photoconductive film diode is formed. Also, the organic photoconductive film 127 is integrally formed on the entire surface of the sensor region, and is not formed in an island shape for each of the plurality of sensor elements in the sensor region. In other words, one organic photoconductive film 127 is provided on the entire sensor area, and one anode electrode 128 and a plurality of cathode electrodes 126 overlap the one organic photoconductive film 127.

In the configuration shown in FIG. 2, as described above, the organic photoconductive film 127 and the anode 128 are formed on the entire surface of the sensor region in common with the respective elements. Accordingly, in FIG. 2, although only the shape of the cathode 126 is illustrated in the sensor element, the organic photoconductive film 127 and the anode 128 are stacked on the cathode 126. More specifically, the organic photoconductive film 127 and the anode electrode 128 exist in the region between the cathode electrodes 126 adjacent to each other in the first direction x and the second direction y, that is, in the region where the cathode electrode 126 is not formed. Since the anode electrode 128 is formed of a silver film 128 of small thickness of about 100 nm, the resistance of the entire cathode is reduced by being connected to a plurality of power supply lines 13. The power supply line 13 may be stacked on the silver film 128 and extend to the power supply circuit 40 as it is, or may extend in the same layer as the drain electrode or the source electrode of the TFT via a through hole formed in the organic passivation film 122 to the power supply circuit 40.

Figure 3:
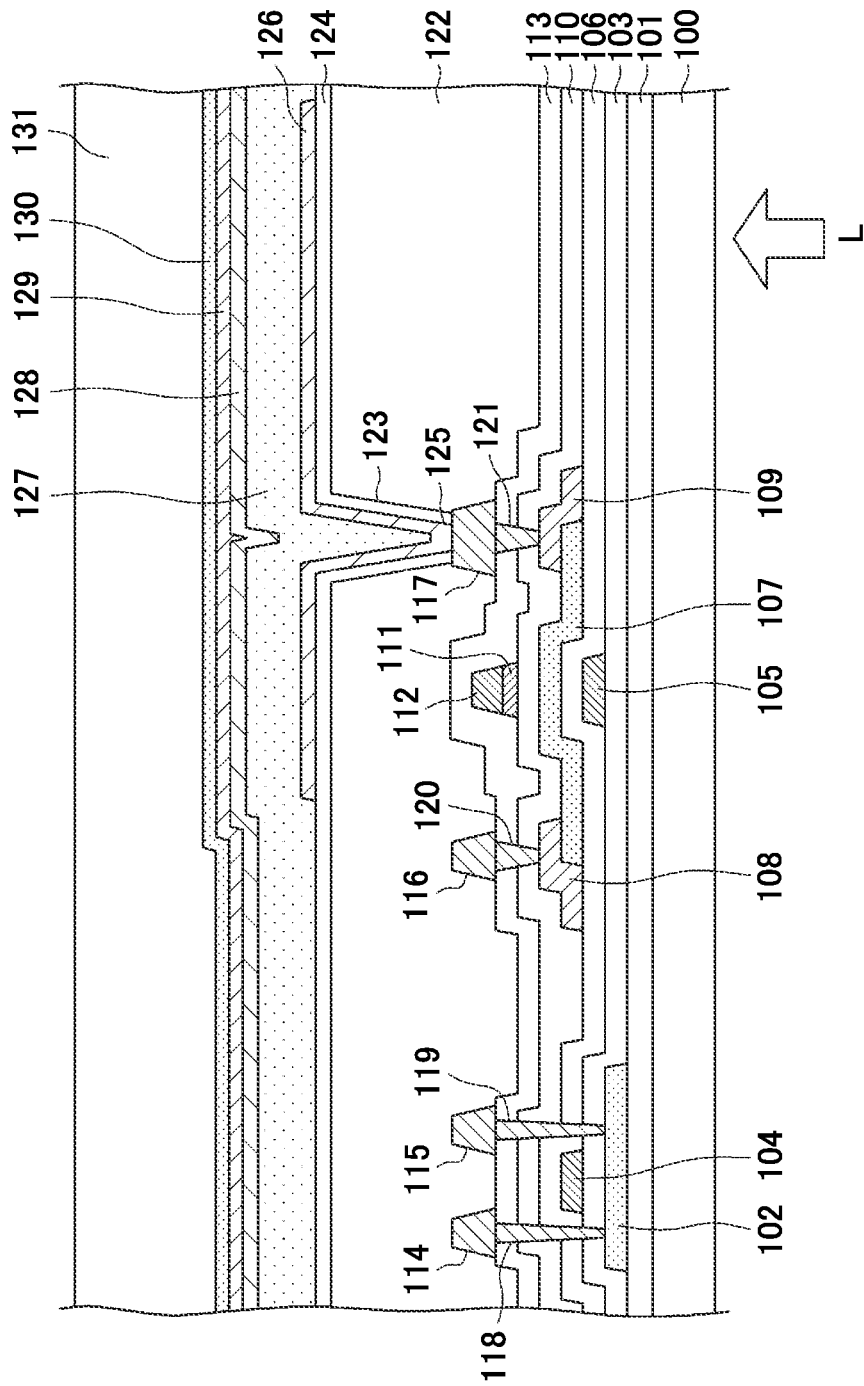
FIG. 3 is a cross-sectional view of the optical sensor device according to embodiment 1.

FIG. 3 is a cross-sectional view of the optical sensor device of FIG. 1; In the optical sensor shown in FIG. 3, light is input from the substrate 100 side. As shown in FIG. 1, a driving circuit formed of a TFT is formed outside the sensor region. Since a polysilicon semiconductor has a large mobility, it is advantageous that the TFT constituting the drive circuit is formed of a polysilicon semiconductor.

On the other hand, it is advantageous that the switching TFT formed in the sensor region is formed of an oxide semiconductor (sometimes referred to as an OS: Oxide Semiconductor) having a small leakage current. Therefore, in this embodiment, a hybrid array substrate using both of a polysilicon semiconductor TFT and an oxide semiconductor TFT is used. In FIG. 3, the left side is a polysilicon TFT for a peripheral circuit, and the central portion is an organic film photodiode and a switching TFT therefor.

Polysilicon is a so-called low-temperature polysilicon in which a-Si (amorphous Silicon) is poly-siliconized by an excimer laser. Nevertheless, since an annealing temperature of a polysilicon semiconductor exceeds a process temperature for forming an oxide semiconductor, a polysilicon semiconductor TFT is formed at first, and then an oxide semiconductor TFT is formed. Thus, a peripheral circuit is manufactured first.

In FIG. 3, a base film 101 made of a laminated film of silicon nitride (SiN) and silicon oxide (SiO) is formed on a glass substrate 100. This is for preventing impurities from the glass substrate 100 from contaminating the polysilicon semiconductor 102 and the oxide semiconductor 107. The thickness of the SiO film is, for example, 200 nm, and the thickness of the SiN film is, for example, 20 nm.

On top of this, a polysilicon film 102 is formed. In the polysilicon film 102, an a-Si film is first formed, and then a-Si is converted into polysilicon by an excimer laser and patterned. The thickness of the polysilicon film 102 is, for example, 50 nm. Note that the SiO film and the SiN film, serving as the base film 101, and the a-Si film can be continuously formed by CVD.

Thereafter, the first gate insulating film 103 is formed of SiO covering the polysilicon semiconductor film 102. A thickness of the first gate insulating film 103 is, for example, 100 nm. Then, a first gate electrode 104 is formed on the first gate insulating film 103 by metal or metal alloy. The first gate electrode 104 is formed of MoW, for example. Incidentally, the peripheral circuit region and the sensor region are formed simultaneously. At the same time as forming the first gate electrode 104, a light shielding film 105 is formed of the same material as the first gate electrode 104 in a portion corresponding to the switching TFT in the sensor region. This light shielding film 105 can be used as a bottom gate electrode of an oxide semiconductor TFT to be formed later.

A first interlayer insulating film 106 is formed of a stacked film of an SiO film and an SiN film covering the first gate electrode 104 and the light shielding film 105. For example, the SiN film has a thickness of 300 nm and the SiO film has a thickness of 200 nm. An oxide semiconductor film 107 is formed over the first interlayer insulating film 106. Examples of the oxide semiconductor include IGZO (Indium Gallium Zinc Oxide), ITZO (Indium Tin Zinc Oxide), ZnON (Zinc Oxide Nitride), and IGO (Indium Gallium Oxide). In this embodiment, IGZO is used as an oxide semiconductor.

In order to maintain characteristics of an oxide semiconductor, it is important to maintain an oxygen amount. Therefore, the upper layer of the first interlayer insulating film 106 needs to be a SiO film. This is because SiN supplies hydrogen to reduce the oxide semiconductor. If the SiO film is in contact with the oxide semiconductor film 107, oxygen can be supplied from the SiO film to the oxide semiconductor.

A drain protective electrode 108 is stacked on a drain region of the oxide semiconductor film 107, and a source protective electrode 109 is formed on a source region thereof. The drain protection electrode 108 and the source protection electrode 109 are formed of a metal, and prevent the oxide semiconductor film 107 from being lost by hydrofluoric acid (HF) in the through holes on the oxide semiconductor TFT side when the through holes in the polysilicon TFT are cleaned with the hydrofluoric acid (HF).

A second gate insulating film 110 is formed of a SiO film covering the oxide semiconductor film 107. The thickness of the SiO film is about 100 nm. A gate alumina film 111 is formed on the SiO film, on which a second gate electrode 112 is formed, for example, of a MoW alloy. By supplying oxygen to the oxide semiconductor film 107 from the second gate insulating film 110 formed of SiO and the gate alumina film 112, the characteristics of the oxide semiconductor film 107 are stabilized.

A second interlayer insulating film 113 is formed of a stacked film of a SiO film and a SiN film covering the second gate electrode 112. For example, the SiO film is 300 nm and the SiN film is 100 nm. In many cases, a SiO film is disposed on the lower side closer to the oxide semiconductor film 107. After forming the second interlayer insulating film 113, through holes 118 and 119 are formed on the polysilicon TFT side of the peripheral circuit, and through holes 120 and 121 are simultaneously formed on the oxide semiconductor TFT side on the sensor region side.

The through-holes 118 and 119 on the side of the polysilicon TFT are subjected to hydrofluoric acid (HF) cleaning in order to remove the oxide film. At this time, hydrofluoric acid (HF) is also introduced into the through holes 120 and 121 on the oxide semiconductor TFT side; to countermeasure the hydrofluoric acid (HF), the drain protective electrode 108 and the source protective electrode 109, which are formed from metal, are used in order to prevent the oxide semiconductor film 107 from being lost.

A first drain electrode 114 and a first source electrode 115 are formed corresponding to the through holes 118 and 119 on the polysilicon TFT side; a second drain electrode 116 and a second source electrode 117 are formed corresponding to the through holes 120 and 121 on the oxide semiconductor TFT side. The second drain electrode 116 is connected to the detection line 12.

An organic passivation film 122 is formed of, for example, acrylic resin covering the second interlayer insulating film 113. Since the organic passivation film 122 also serves as a planarization film, it is formed to have a thickness of about 2 μm. Through hole 123 for connecting the source electrode 117 and the cathode 126 of the photodiode is formed in the organic passivation film 122 corresponding to the source electrode 117 of the TFT. Since the thickness of the organic passivation film 122 is large, the diameter of the through hole 123 is also large.

An inorganic passivation film 124 is formed to a thickness of about 20 to 100 nm, for example, with SiN covering the organic passivation film 122. Impurities such as moisture are released from the organic passivation film 122; the inorganic passivation film 124 prevents the organic photoconductive film 127, formed on upper side, from being contaminated.

On the inorganic passivation film 124, a cathode electrode 126 is formed by an ITO (Indium Tin Oxide) film to a thickness of, e.g., about 50 nm. The ITO film is crystallized by annealing to reduce electric resistance. Through holes 125 are formed in the inorganic passivation film 124 at the through holes 123 of the organic passivation film 122 to connect the cathode electrode 126 with the source electrode 117. In the present invention, ITO is also used for the upper electrode side, which is the anode electrode 128 side; therefore, the ITO as the cathode electrode 126 is sometimes referred to as cathode ITO 126 in order to distinguish it from the anode side TFT.

An organic photoconductive film 127 is formed on the cathode 126 with a thickness of 300 to 500 nm. The organic photoconductive layer 127 is formed by sputtering or vacuum evaporation. Since the organic photoconductive film 127 has a wavelength selectivity as well as superior photoconductive characteristics, it can be used as a so-called bio-recognition sensor, e.g. for vein images.

An anode electrode 128 is formed of a silver film on the organic photoconductive film 127. Silver has an excellent reflectivity when it becomes 90 nm or more. Also, the work function is suitable as the anode electrode 128, and the conductivity is also excellent.

On the other hand, since the organic photoconductive film 127 is vulnerable to impurities such as moisture and the like, it is necessary to block it from outside, therefore, the alumina (AlOx) film 130 of a thickness of approximately 30 nm is formed to cover the silver film 128 which is an anode electrode 128. The alumina (AlOx) film 130 is formed by sputtering, however, film formation rate is very low; thus, a reactive sputtering is used. Alumina (AlOx) 130 formed by reactive sputtering contains a large amount of oxygen. Incidentally, for the purpose of blocking moisture and the like, the alumina (AlOx) film preferably has a thickness of 10 to 50 nm.

However, since silver has strong reducibility, oxygen is removed from the alumina (AlOx) film 130 and the silver film 128 is oxidized. When the silver film 128 is oxidized, electric resistance increases and blackening occurs. Further, when the oxidation is further progressed, the silver film is made transparent. Then, the silver film 128 does not serve as a reflective electrode.

A feature of the present invention is to prevent oxidation of the silver film 128 by the alumina (AlOx) film 130 by forming an ITO film 129 between the silver film (or anode electrode) as the reflective electrode 128 and an alumina (AlOx) film 130 for moisture block. The thickness of the alumina (AlOx) film 130 may be about 7 nm. As the thickness of the ITO film increases, crystallization proceeds, and unevenness becomes conspicuous on the surface of ITO, and therefore, even when the thickness is increased, the thickness is preferably about 70 nm. The thickness of the ITO film 129 for this purpose is, for example, from 5 to 70 nm, and more preferably from 7 to 20 nm.

The ITO film 129 can be continuously sputtered without breaking the vacuum in a chamber in which the silver film 128 is sputtered. Therefore, it is possible to prevent the silver film 128 from being oxidized by oxygen in the atmosphere. On the other hand, since the alumina (AlOx) film 130 is sputtered in a separate chamber from the silver film 128, if the ITO film 129 is not present, the silver film 128 is oxidized even by oxygen in the atmosphere before the formation of the alumina (AlOx) 130. However, in this embodiment, since the silver film 128 is already covered with the ITO film 130, oxidation due to oxygen in the atmosphere can be prevented.

The ITO film 129 itself also contains oxygen. However, the amount of oxygen supplied from the ITO film 129 is much smaller than that from the alumina (AlOx) film 130. Note that the ITO film 129 on the anode side is formed after the organic photoconductive film 127 is formed. Since the organic photoconductive film 127 is vulnerable to heat, the ITO film 129 on the anode side is formed at a low temperature, e.g., at a substrate temperature of about 30 degrees Celsius. Since the film thickness is also as thin as about 7 nm, the ITO 129 on the anode side is formed in an amorphous state. It can be assumed that such an amorphous ITO thin film 129 does not supply oxygen which oxidizes the silver film 128 as a reflective electrode.

Since the ITO film 129 on the anode side has a thin film thickness of about 7 nm, it can be formed by ordinary sputtering rather than by reactive sputtering using oxygen. Also in this respect, the amount of oxygen contained in the ITO film 129 can be suppressed more than usual.

In FIG. 3, an organic protective film 131 is formed of a resin such as acrylic for mechanical protection on an alumina (AlOx) film 130. The organic protective film 131 may be omitted depending on a product.

FIGS. 4A to 6 show the effects of the present embodiment. In this embodiment, an ITO film 129 for preventing the oxidation of the silver film 128 is formed between the silver film 128 as a reflective electrode and an alumina (AlOx) film 130 as a moisture block on the anode side. In such a configuration, FIG. 4A to FIG. 6 show how an effect can be obtained when the ITO film 129 is formed to have a thickness of about 7 nm.

Figure 4A:
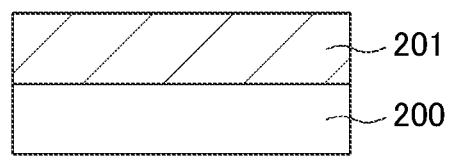
FIG. 4A is a cross-sectional view of a sample A in which only a silver film 201 is formed on a glass substrate.
Figure 4B:
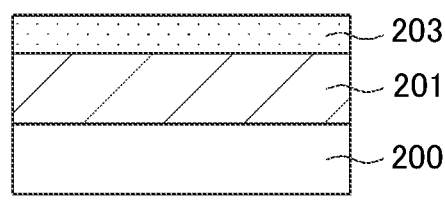
FIG. 4B is a cross-sectional view of a sample B in which alumina (AlOx) film is formed on the silver film.
Figure 4C:
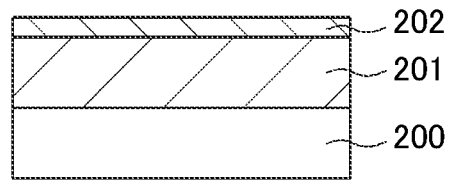
FIG. 4C is a cross-sectional view of a sample C in which an ITO film is formed on the silver film.
Figure 4D:
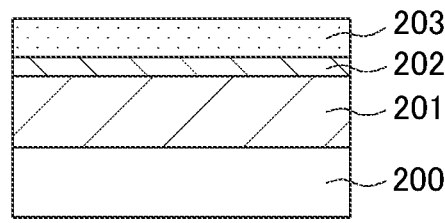
FIG. 4D is a cross-sectional view of a sample D in which an ITO film 202 is formed on a silver film 201 and an alumina (AlOx) film 203 is formed on the ITO film.

FIGS. 4A to 4D show samples of various membrane configurations for confirming the effect. In FIGS. 4A to 4D, the film thickness of the ITO film 202 is 7 nm, and the thickness of the alumina (AlOx) film is 30 nm. As a film thickness of the silver film 201, a sample whose thickness was changed like a 100 nm, 200 nm, 300 nm, 400 nm, 500 nm was prepared. All of the films are formed by sputtering. FIG. 4A is a cross-sectional view of a case where only a silver film 201 is formed on a glass substrate 200. FIG. 4B shows a case where alumina (AlOx) film 203 is formed on the silver film 201. FIG. 4C shows a case where an ITO film 202 is formed on the silver film 201. FIG. 4D shows a case where an ITO film 202 is formed on a silver film 201 and an alumina (AlOx) film 203 is formed thereon, which is the film structure according to embodiment 1.

FIG. 5 shows the condition for forming the ITO film 202 used for the sample. The ITO film 202 is formed to a thickness of 7 nm by sputtering, and the characteristic is that the sample substrate is maintained at 30 degrees Celsius. In other words, the temperature of the organic photoconductive film in FIG. 3 is taken into consideration. Further, the oxygen flow rate is 0.05 sccm (standard cubic centimeter per minute) and is very small compared with an argon (Ar) flow rate of 140 sccm. It is considered that the ITO film formed under such conditions is amorphous and has a small oxygen content.

In FIGS. 4B to 4D, the silver film 201 and the ITO film 202 are successively formed in the same chamber, however, the alumina (AlOx) film 203 was formed by exposing the substrate 200 on which an ITO film is formed to an atmosphere and then, sputtering the alumina (AlOx) in another chamber. Since the state of oxidation of the silver film 201 appears remarkably in electric resistance, the state of oxidation of the silver film 201 is measured by measuring the sheet resistance of the silver film 201.

After forming the films of FIGS. 4A to 4D, the sheet resistance of the silver film 201 was measured by Lowlesta (Product Name). A Lowlesta is used for measuring the sheet resistance using 4 needles, and an alumina (AlOx) film 203, which is an insulating material on the surface, is penetrated by a needle. Thus, the sheet resistance of the silver film 201 can be measured. If the silver film 201 is oxidized, its sheet resistance becomes very large.

Figure 6:
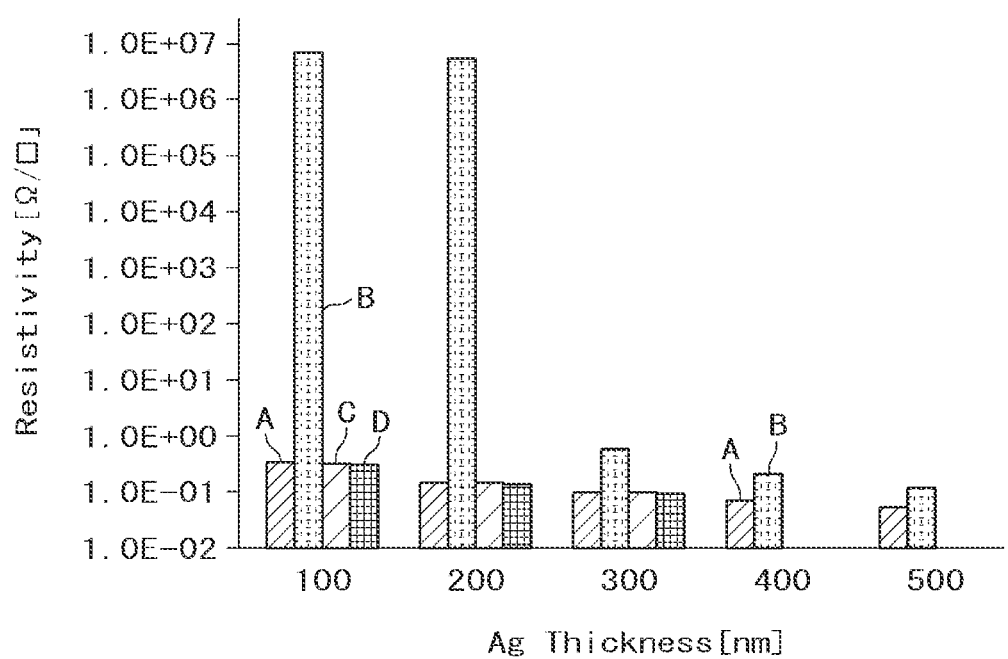
FIG. 6 is a graph to show an effect of ITO film between the silver film and the alumina (AlOx) film.

FIG. 6 is a graph showing an evaluation result. In FIG. 6, the horizontal axis represents the thickness of the silver film 201, and the vertical axis represents the sheet resistance of the silver film 201. Since the resistance of the silver film 201 largely changes due to oxidation, the vertical axis is a log scale. In the case where the film thickness of the silver film 201 was 100 nm, 200 nm, 300 nm, all of the samples 4A to 4D were prepared and evaluated, and when the thickness of the silver film 201 was 400 nm and 500 nm, only samples 4A and 4B were prepared and evaluated. The resistance value was measured immediately after film fabrication.

In FIG. 6, A corresponds to sample 4A, B corresponds to sample 4B, C corresponds to sample 4C, and D corresponds to sample 4D. When the thickness of the silver film 201 is 100 nm, a sample B in which an alumina (AlOx) film 203 is stacked on the silver film 201 has a resistance of $9 \times 10^6$, and is much larger than that of other samples. In other words, it is understood that the silver film 201 has been oxidized by alumina (AlOx) over the entire thickness direction.

On the other hand, there is only little difference in resistance among the sample A, which is only the silver film 201, the sample B, in which the ITO film 202 is laminated on the silver film 201, and the sample D, in which the ITO film 202 and the alumina (AlOx) film 203 are laminated on the silver film 201. In particular, attention is given to Sample B and sample D, and it is understood that the effect of oxidation of the silver film 201 by the alumina (AlOx) film 203 having a thickness of 30 nm is almost eliminated only by disposing the ITO film 202 having a film thickness of 7 nm between the silver film 201 and the alumina (AlOx) film 203.

This tendency is the same even when the thickness of the silver film 201 is 200 nm. As shown in Sample B, even when the film thickness of the silver film 201 is 200 nm, the sheet resistance is substantially the same as in the case where the film thickness is 100 nm. In other words, it is understood that the effect of the alumina (AlOx) film 203 to oxidize the silver reaches to a thickness of approximately 200 nm of the silver film 201.

On the other hand, when attention is paid to the samples A, C, and D, when the thickness of the silver film 201 is 200 nm, the resistance of the silver film 201 is about half of that when the thickness of the silver film 201 is 100 nm (note the vertical axis of FIG. 6 is a log scale). Thus, it can be seen that Samples A, C, and D are hardly oxidized.

When the film thickness of silver is 300 nm, the sheet resistance value of the silver film 201 decreases to almost the same level as that of the other samples A, C, and D even in Sample B. In other words, it is understood that the influence of the alumina (AlOx) film 203 having a thickness of 30 nm does not reach about 300 nm of the silver film 201. Accordingly, it is understood that the influence of the alumina (AlOx) film 203 having a thickness of 30 nm extends from the interface between the silver film 201 and the alumina (AlOx) film 203 to about 200 to 300 nm.

On the other hand, when Sample C and Sample D are compared with each other, there is little difference in the sheet resistance of the silver film 201. In other words, since an ITO film 203 of about 7 nm is present between the silver film 201 and the alumina (AlOx) film 203, it is possible to almost eliminate the influence of the alumina (AlOx) film 203 on the silver film 201.

When the thickness of the silver film 203 is 400 nm and the thickness of the silver film 203 is 500 nm, only the samples A and B are measured. As the thickness of the silver film 201 increases, the influence of the alumina (AlOx) film 203 stacked on the surface of the silver film 203 becomes small. However, in actual products, forming a silver film 201 of 300 nm or more is disadvantageous in terms of cost. In an actual product, the thickness of the silver film 103 is 200 nm or less, more preferably the thickness of the silver film 103 is between 90 and 120 nm.

In such a range of thickness of the silver film 202, it is very effective to form an ITO film 202 between the silver film 201 and the alumina (AlOx) film 203. With this configuration, it is possible to realize an optical sensor using an organic photoconductive film having excellent reflection characteristics and high reliability.

In the above description, the organic photoconductive film and the anode, i.e., the silver film, are commonly formed in the entire sensor region, but the same applies to the case where the organic photoconductive film or the anode is formed for each of the individual sensor elements. Further, in the above description, a case has been described in which a thin film of ITO is disposed between a silver film and an alumina (AlOx) film, but a similar effect can be obtained for a transparent oxide film such as AZO (Antimony Zinc Oxide) or IZO (Indium Zinc Oxide) instead of ITO.

Embodiment 2

In the optical sensor of Embodiment 1, light L is incident from the substrate 100 side in FIG. 3. On the other hand, there is an optical sensor of a type in which light is incident on the opposite side of the substrate 100, i.e., from the side of the upper electrode 128 of the photoconductive film 127. When light is incident from the side of the upper electrode 128, a reflective film is formed on the side of the lower electrode 126, and the upper electrode 128 becomes a transparent electrode. In a configuration in which light is incident from the side of the upper electrode 128, a switching TFT or a driving TFT can be formed between the lower electrode 126 and the substrate 100, which is advantageous in terms of space.

Incidentally, when silver becomes a thin film having a film thickness of 50 nm or less, particularly 30 nm or less, it transmits visible light. By utilizing this property, it is possible to realize an optical sensor in which light is incident from the side of the upper electrode 128 without changing the basic structure of the optical sensor described in Embodiment 1 (hereinafter, also referred to as an upper light incident type).

Figure 7:
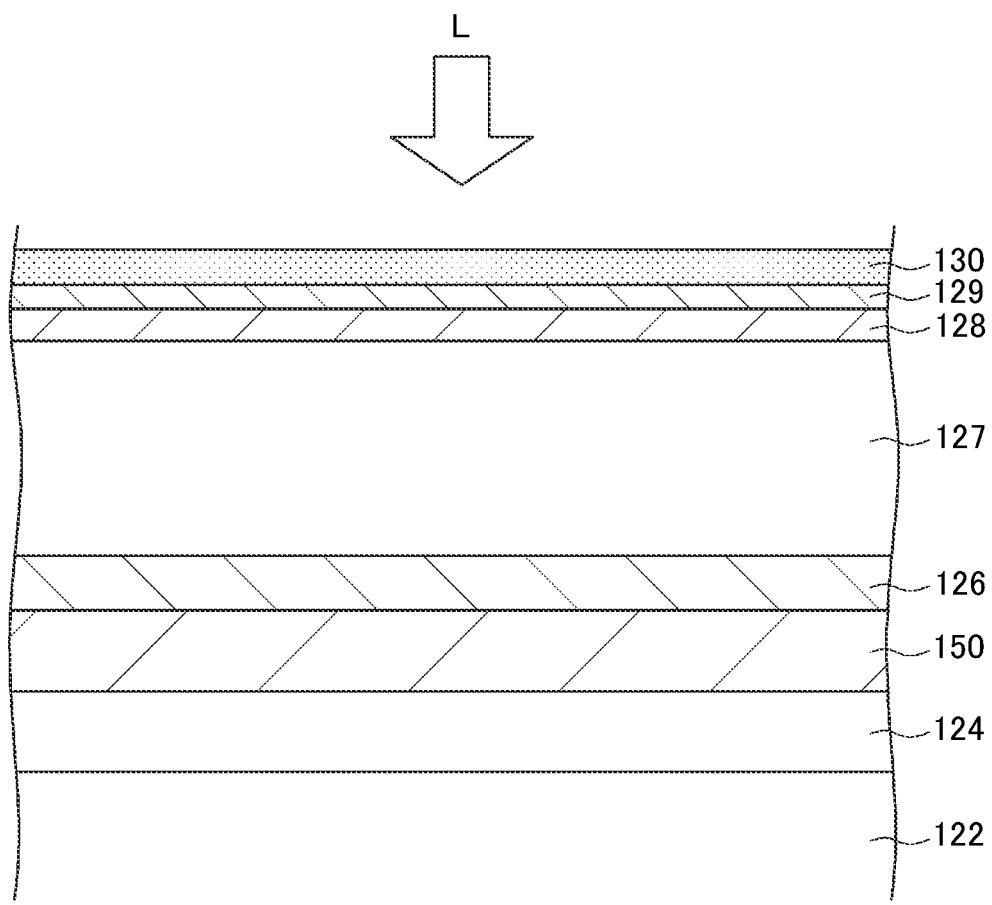
FIG. 7 is a cross-sectional view of the optical sensor device in the vicinity of the photo conductive film according to embodiment 2.

FIG. 7 is a cross-sectional view of an organic photodiode portion in Embodiment 2. Since the configuration of the switching TFT and the driving TFT are the same as that described with reference to FIG. 3, only the organic photodiode portion is shown in FIG. 7. In FIG. 7, an inorganic passivation film 124 is formed on an organic passivation film 122, for example, by a SiN film having a thickness of 100 nm. On the inorganic passivation film 124, a reflective film 150 made of silver, aluminum, an aluminum alloy or the like is formed to have a thickness of about 100 nm. A cathode 126 is formed from an ITO film of a thickness of about 50 nm thereon. FIG. 7 differs from FIG. 3 of Embodiment 1 in that a reflecting film 150 made of metal is formed under the cathode 126.

The organic photoconductive film 127 is formed on the cathode 126 with a thickness of 300 to 500 nm as shown in FIG. 3. An anode 128 is formed of a silver film on an organic photoconductive film 127. In FIG. 7, the silver film as the anode 128 does not act as a reflective electrode, but rather needs to pass light. Therefore, the thickness of the silver film 128 is 50 nm or less, preferably 20 to 30 nm. When the thickness of silver film becomes equal to this level, a transmittance of the silver film becomes equal to or higher than that of ITO film.

An ITO film 129 for preventing the oxidation of silver is formed on the anode 128 by about 7 nm. The ITO film 129 is formed by low-temperature sputtering in succession to the silver film 128. As described in Embodiment 1, the ITO film 129 is an amorphous film. However, in the configuration of FIG. 7, since the thickness of the ITO film 129 is preferably reduced in order to prevent the attenuation of light, a more preferable thickness is 5 to 20 nm.

On the ITO film 129, an alumina (AlOx) film 130 having a thickness of, e.g., about 10 to 50 nm is formed, the same as Embodiment 1. This is for preventing an organic photoconductive film from being contaminated from external moisture or the like. In the configuration shown in FIG. 7, in order not to attenuate the light, a more preferable range of the alumina film 130 is 10 to 30 nm. Since oxygen from the alumina film 130 is blocked by the ITO film 129, it does not reach the anode 128, and the silver film 128 is not oxidized, therefore the conductivity of the silver film 128 can be maintained.

Although the silver film 128 is thin, as shown in FIGS. 1 and 2, since the power supply line 13 extends in the vertical direction, the potential drop of the anode 128 can be prevented. In other words, since the thin silver film 128 only needs to act as a conductive film only at each sensor element, an increase in the resistance value caused by thinning of the silver film 128 does not become a substantial problem unless the silver film 128 is oxidized.

As described above, by forming the ITO thin film 129 between the silver film 128 as the anode and the alumina (AlOx) 130 for the moisture block, it is possible to prevent the oxidation of the silver thin film 128, and thus it is possible to realize an optical sensor having an organic photoconductive film of an upper surface incident type.

In the above description, a case in which an organic photoconductive film is used as an optical sensor has been described; however, the present invention is not limited to this, and the present invention can be applied to other optical sensors in the case where silver is used as a cathode or an anode. Further, while the present invention has been described with reference to an optical sensor using an organic photoconductive film, the present invention is not limited thereto and can be used in an organic EL display device using an organic EL film and so forth.

What is claimed is:

1. A semiconductor device having a thin film transistor formed on a substrate, comprising:
   an electrode formed from a silver film electrically connected to the thin film transistor,
   a first ITO film formed on the silver film, and
   an alumina (AlOx) film formed on the first ITO film,
   wherein the semiconductor device includes a photo sensor,
   the photo sensor includes a photodiode which includes an anode, a photoconductive film, and a cathode, and
   the electrode is an anode of the photo diode.

2. The semiconductor device according to claim 1, wherein the photoconductive film is an organic photoconductive film.

3. The semiconductor device according to claim 2, wherein a thickness of the first ITO film is 5 to 20 nm.

4. The semiconductor device according to claim 3, wherein a thickness of the silver film is 90 to 200 nm.

5. The semiconductor device according to claim 3, wherein a thickness of the alumina (AlOx) film is 10 to 50 nm.

6. The semiconductor device according to claim 5, wherein the first ITO film is an amorphous ITO film.

7. The semiconductor device according to claim 6, wherein the cathode is formed from a second ITO film and is directly connected to the thin film transistor.

8. The semiconductor device according to claim 6, wherein the second ITO film is crystalized ITO film.

9. The semiconductor device according to claim 2, wherein a plurality of the thin film transistors are formed in a sensor area of the substrate, and
   the organic photoconductive film, the anode, the first ITO film, and the alumina (AlOx) film are formed integrally over the entire region of the sensor area, and overlaps the plurality of thin film transistors.

10. A semiconductor device including an optical sensor, the optical sensor including:
    a thin film transistor formed on a substrate, and
    a photodiode formed above the thin film transistor,
    the photodiode including an anode, a photoconductive film, and a cathode,
    wherein light is detected from an opposite side of the substrate,
    the anode is formed from a silver film,
    a first ITO film is formed on the silver film, and
    an alumina (AlOx) film is formed on the first ITO film.

11. The semiconductor device according to claim 10, wherein the photoconductive film is an organic photoconductive film.

12. The semiconductor device according to claim 10, wherein a thickness of the first ITO film is 5 to 20 nm.

13. The semiconductor device according to claim 12, wherein a thickness of the silver film is 20 to 50 nm.

14. The semiconductor device according to claim 13, wherein a thickness of the alumina (AlOx) film is 10 to 30 nm.

15. The semiconductor device according to claim 14, wherein the first ITO film is amorphous ITO film.

16. The semiconductor device according to claim 15, wherein the cathode is formed from a second ITO film, and
    a reflective film, formed from a metal or an alloy, is formed under the second ITO film.

17. The semiconductor device according to claim 16, wherein the second ITO film is crystalized ITO film.

* * * * *